(12) United States Patent
Bai

(10) Patent No.: US 11,968,878 B2
(45) Date of Patent: Apr. 23, 2024

(54) DISPLAY PANEL

(71) Applicant: Wuhan China Star Optoelectronics Semiconductor Display Technology Co., Ltd., Hubei (CN)

(72) Inventor: Sihang Bai, Hubei (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 795 days.

(21) Appl. No.: 17/051,472

(22) PCT Filed: Jun. 15, 2020

(86) PCT No.: PCT/CN2020/096103
§ 371 (c)(1),
(2) Date: Oct. 29, 2020

(87) PCT Pub. No.: WO2021/217806
PCT Pub. Date: Nov. 4, 2021

(65) Prior Publication Data
US 2023/0165116 A1    May 25, 2023

(30) Foreign Application Priority Data

Apr. 27, 2020 (CN) .......................... 202010344014.0

(51) Int. Cl.
*H10K 59/80* (2023.01)
*H10K 59/12* (2023.01)
*H10K 59/40* (2023.01)
*H10K 77/10* (2023.01)

(52) U.S. Cl.
CPC .......... *H10K 59/873* (2023.02); *H10K 59/40* (2023.02); *H10K 59/12* (2023.02); *H10K 77/10* (2023.02)

(58) Field of Classification Search
CPC ...... H10K 59/12; H10K 59/40; H10K 59/873; H10K 77/10
See application file for complete search history.

(56) References Cited

U.S. PATENT DOCUMENTS

| 5,897,414 A * | 4/1999 | Bergeron ................. H01J 9/42 445/24 |
| 2019/0073505 A1* | 3/2019 | Kwon ..................... H05K 1/028 |
| 2020/0194721 A1* | 6/2020 | Lee ......................... H10K 59/40 |

FOREIGN PATENT DOCUMENTS

| CN | 109273497 | 1/2019 |
| CN | 110610970 | 12/2019 |
| CN | 110634928 | 12/2019 |
| CN | 111145646 | 5/2020 |
| CN | 111162194 | 5/2020 |

(Continued)

*Primary Examiner* — Evan P Dzierzynski
*Assistant Examiner* — Nathaniel J Lee

(57) ABSTRACT

A display panel is provided in the present disclosure. The display panel has an additional function area, and the display panel includes a substrate, an array layer and a light-emitting device layer disposed in sequence on the substrate, an encapsulation layer covering the light-emitting device layer, and a touch layer disposed on the encapsulation layer. An opening area surrounded by the additional function area is disposed at an edge position of the additional function area. An opening penetrating the array layer and extending to a surface of the substrate is defined by the opening area, and the opening is filled with a light-blocking layer.

19 Claims, 3 Drawing Sheets

(56) References Cited

FOREIGN PATENT DOCUMENTS

| CN | 111403617 | 7/2020 |
|---|---|---|
| KR | 10-2019-0066205 | 6/2019 |

\* cited by examiner

DISPLAY PANEL

RELATED APPLICATIONS

This application is a National Phase of PCT Patent Application No. PCT/CN2020/096103 having International filing date of Jun. 15, 2020, which claims the benefit of priority of Chinese Patent Application No. 202010344014.0 filed on Apr. 27, 2020. The contents of the above applications are all incorporated by reference as if fully set forth herein in their entirety.

FIELD AND BACKGROUND OF THE INVENTION

The present disclosure relates to the field of display technologies, and more particularly, to a display panel.

In the current market, narrow-border screens or borderless screens have become the main direction of small-sized mobile phones. Realizing a small-sized display panel with a narrow-border design to achieve a great screen-body ratio is a direction that the industry has been working hard.

A display panel includes generally a substrate, an array layer, a light-emitting device layer, an encapsulation layer, and a touch layer with a stacked arrangement. An upper border area of the display panel is generally provided with electronic components, such as a front camera. In order to reduce the upper border area, in this industry, the camera is disposed under the screen, and a light-transmitting hole is opened in the area placing the camera. That is, the light-shielding film layer in a camera area, such as the metal layer in the array layer, and the cathode layer in the light-emitting device layer, is removed to form the light-transmitting hole. However, when the light-transmitting hole is formed, cracks may be formed on the substrate near the edge of the light-transmitting hole. Generally, an optical adhesive layer is filled at the edge of the light-transmitting hole to prevent a touch layer from an uneven depth caused by the cracks formed on the substrate during the formation of the touch layer.

However, the optical adhesive layer has high light transmittance, and the area with the light-transmitting hole is prone to light leakage, thereby affecting the normal operation of organic light emitting diode (OLED) device.

Technical Problems

In the existing display panel, the adhesive layer is filled at the edge of the light-transmitting hole, and the optical adhesive layer has high light transmittance, thereby the area with the light-transmitting hole is prone to light leakage.

SUMMARY OF THE INVENTION

Technical Solutions

In a first aspect, the present disclosure provides a display panel, the display panel has a display area and an additional function area, the display area surrounds at least a portion of the additional function area, and the display panel includes:
 a substrate;
 an array layer disposed on the substrate;
 a light-emitting device layer disposed on the array layer;
 an encapsulation layer covering the light-emitting device layer;
 a touch layer disposed on the encapsulation layer;
 wherein an opening area surrounding the additional function area is disposed at an edge position of the additional function area, an opening penetrating the array layer and extending to a surface of the substrate is disposed by the opening area, and the opening is filled with a light-blocking layer.

In some embodiments, the light-blocking layer is made of a black material.

In some embodiments, the black material comprises polyimide.

In some embodiments, an upper surface of the light-blocking layer is flush with an upper surface of a portion of the encapsulation layer located in the display area.

In some embodiments, a groove located in the opening area is defined by the substrate surrounding the additional function area.

In some embodiments, a width of a bottom portion of the groove is greater than a width of a top portion of the groove.

In some embodiments, a portion of the encapsulation layer is in the groove.

In some embodiments, a portion of the encapsulation layer in the opening area is covered by the light-blocking layer, and the groove is filled with the light-blocking layer.

In some embodiments, a plurality of grooves are provided and spaced from each other.

In some embodiments, a retaining wall located in the opening area is disposed on the substrate surrounding the additional function area.

In some embodiments, a plurality of grooves are defined respectively by an inner side of the retaining wall and an outer side of the retaining wall.

In a second aspect, the present disclosure further provides a display panel, the display panel has a display area and an additional function area, the display area surrounds at least a portion of the additional function area, and the display panel includes:
 a substrate;
 an array layer disposed on the substrate;
 a light-emitting device layer disposed on the array layer;
 an encapsulation layer covering the light-emitting device layer; and
 a touch layer disposed on the encapsulation layer;
 wherein an opening area surrounding the additional function area is disposed at an edge position of the additional function area, an opening penetrating the array layer and extending to a surface of the substrate is defined by the opening area, and the opening is filled with a light-blocking layer, wherein the light-blocking layer is made of a black material, and an upper surface of the light-blocking layer is flush with an upper surface of a portion of the encapsulation layer located in the display area.

In some embodiments, the black material comprises polyimide.

In some embodiments, a groove located in the opening area is defined by the substrate surrounding the additional function area.

In some embodiments, a width of a bottom portion of the groove is greater than a width of a top portion of the groove.

In some embodiments, a portion of the encapsulation layer is in the groove.

In some embodiments, a portion of the encapsulation layer in the opening area is covered by the light-blocking layer, and the groove is filled with the light-blocking layer.

In some embodiments, a plurality of grooves are provided and spaced from each other.

In some embodiments, a retaining wall located in the opening area is disposed on the substrate surrounding the additional function area.

In some embodiments, a plurality of grooves are defined respectively by an inner side of the retaining wall and an outer side of the retaining wall.

Beneficial Effect:

The light-blocking layer is used to fill the cracks on the substrate and planarize the substrate to prevent the touch layer from an uneven depth caused by the cracks during the formation of the touch layer. In addition, the light-blocking layer is also used to prevent light leakage at the opening, thereby avoiding the light leakage affecting the performance of the OLED device.

DESCRIPTION OF SPECIFIC EMBODIMENTS OF THE INVENTION

In order to make the purpose, technical solutions, and effects of the present application clearer and clearer, the present application will be described in further detail below with reference to the accompanying drawings and examples. It should be understood that the specific embodiments described herein are only used to explain the present application, and are not used to limit the present application.

The present disclosure focus on the technical problems in the existing display panel that the adhesive layer is filled at the edge of the light-transmitting hole, and the optical adhesive layer has high light transmittance, thereby the area with the light-transmitting hole is prone to light leakage.

Figure 1:
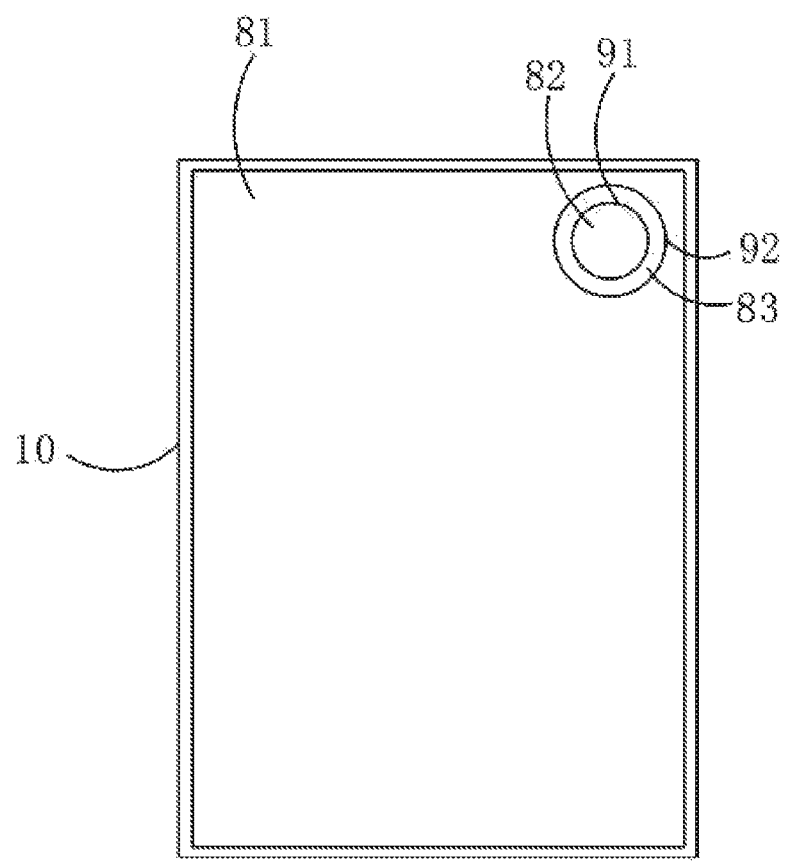
FIG. 1 is a schematic diagram of a display panel according to one embodiment of the present disclosure.
Figure 2:
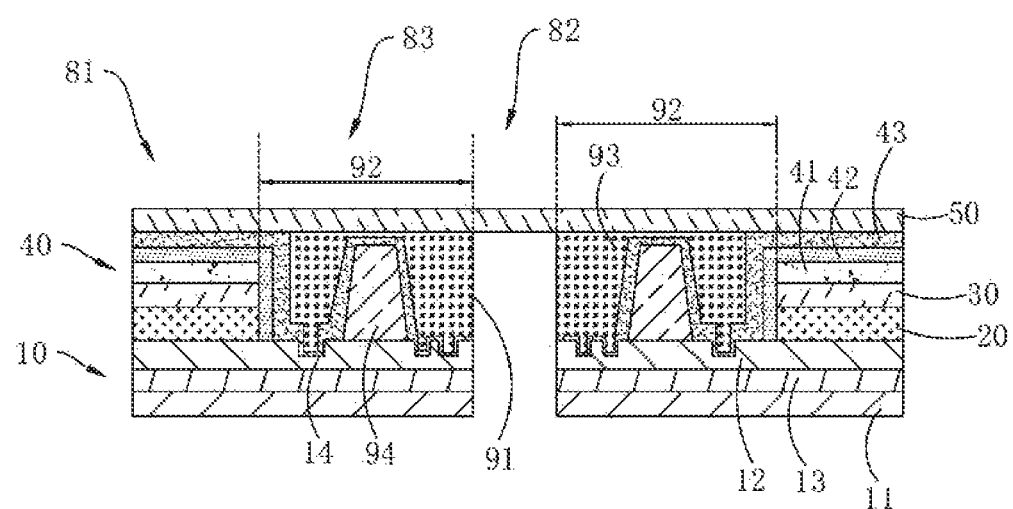
FIG. 2 is a schematic structural diagram of a portion of a display panel according to one embodiment of the present disclosure.

As shown in FIG. 1 and FIG. 2, a display panel is provided. The display panel has a display area 81 and an additional function area 82, the display area 81 surrounds at least a portion of the additional function area 82. The display area 81 is used for displaying, and the additional function area 82 is used for correspondingly disposing optical devices such as cameras and optical sensors. A light-transmitting hole is defined by the additional function area 82, and the light-transmitting hole is used to a light-transmitting channel for the optical devices.

Specifically, the display panel includes a substrate 10, an array layer 20 disposed on the substrate 10, a light-emitting device layer 30 disposed on the array layer 20, an encapsulation layer 40 covering the light-emitting device layer 30, and a touch layer 50 disposed on the encapsulation layer 40.

In which, the light-transmitting hole may penetrate the substrate 10 and the array layer 20.

In one embodiment, the substrate 10 includes a first basic layer 11, a second basic layer 12, and an isolation layer 13 between the first basic layer 11. The material of the first basic layer 11 and the second basic layer 12 is light-transmitting polyimide.

Specifically, an opening area 83 surrounding the additional function area 82 is disposed at an edge position of the additional function area 82, and an opening 92 penetrating the array layer 20 and extending to a surface of the substrate 10 is defined by the opening area 83.

It should be noted that the opening 92 that penetrates the array layer 20 and extends to the surface of the substrate 10 is formed by laser cutting or the like, after the array layer 20 is formed on the substrate 10.

Specifically, the opening 92 is filled with a light-blocking layer 93.

After the encapsulation layer 40 is formed on the light-emitting device layer 30, the opening 92 is filled with a light-blocking material to form the light-blocking layer 93. It should be noted that when the opening 92 is formed by cutting, cracks are easily formed on a portion of the substrate 10 located at the edge of the additional function area 82. The light-blocking layer 93 is used to fill the cracks on the substrate 10 and planarize the substrate 10 to prevent the touch layer 50 from an uneven depth caused by the cracks during the formation of the touch layer 50. In addition, the light-blocking layer 93 is also used to prevent light leakage at the opening 92, thereby avoiding the light leakage affecting the performance of the OLED device.

Specifically, the light-blocking layer 93 is made of a black material. The black material has a strong absorption ability, therefore the light-blocking layer 93 has a high light-blocking ability.

In one embodiment, the material of the light-blocking layer 93 includes black polyimide.

It should be noted that the material of the substrate 10 includes polyimide. The light-blocking layer 93 is formed with the same material as substrate 10, so that the light-blocking layer 93 can better fill the cracks 14 on substrate 10, preventing water and oxygen from invading from the side surface of substrate 10.

It should be noted that, in actual implementation, the material of the light-blocking layer 93 may also be black silicon nitride or silicon oxide, etc.

Specifically, a retaining wall 94 located in the opening area 83 is disposed on the substrate 10 surrounding the additional function area 82.

The retaining wall 94 is used to prevent the organic material in the array layer 20 from flowing into the additional function area 82, thereby preventing the organic material from affecting the light-capturing of photosensitive elements such as the camera. In addition, the retaining wall 94 also can prevent water and oxygen from invading from the side portion along with the organic material in array layer 20.

In one embodiment, a gap is defined between the retaining wall 94 and an inner sidewall of the opening 92.

It is known to the person skilled in the art that when the opening 92 is formed by cutting, cracks 14 are easily formed on the substrate 10 at the edge position of the opening 92, and the cracks 14 is denser in a region where close to the inner wall of the opening 92. By defining the gap between the retaining wall 94 and the inner sidewall of the opening 92, the area with the dense cracks 14 is covered by a second inorganic layer 43, thereby preventing water and oxygen from invading the OLED device through the cracks 14. Specifically, the light-blocking layer 93 covers the retaining wall 94 and fills the gap.

In one embodiment, the retaining wall is covered by the encapsulation layer 40, wherein the encapsulation layer 40 includes a first inorganic layer 41, organic layer 42, and the second inorganic layer 23 with a stacked arrangement.

It should be noted that, for the person skilled in the art, the organic material layer has a better flatness, and it is easy to form a flat film layer on the organic material layer. The inorganic material layer has a desirable water and oxygen barrier ability, which can prevent the water and oxygen from invading the display device.

Specifically, an upper surface of the light-blocking layer 93 is flush with an upper surface of a portion of the encapsulation layer 40 located in the display area 91.

Further, the upper surface of the light-blocking layer 93 is flush with an upper surface of a portion of the second inorganic layer 43 located in the display area 91, such that the touch layer 50 can be formed uniformly.

Specifically, a groove 14 located in the opening area 83 is defined by the substrate 10 surrounding the additional function area 82.

When the organic layer 42 is formed, the groove 14 is used to prevent the organic layer 42 from extending toward the additional function area 82, thereby preventing water and oxygen from invading the OLED device from the side surface.

Further, a width of a bottom portion of the groove 14 is greater than a width of a top portion of the groove 14, such that a better partition effect is obtained.

Specifically, a portion of the encapsulation layer 14 is in the groove 14.

The portion of the encapsulation layer 14 is used to fill a portion of the groove 14 to prevent water and oxygen from invading from the side portion of the groove 14.

Further, a portion of the encapsulation layer 40 in the opening area 83 is covered by the light-blocking layer 93, and the groove 14 is filled with the light-blocking layer 93.

The encapsulation layer 40 is used to prevent water and oxygen from invading from the side, and to fill the groove 14 to prevent the touch layer from form an uneven depth caused during the formation of the touch layer.

Further, a plurality of grooves 14 are provided and spaced from each other.

Further, the plurality of grooves 14 are defined respectively by an inner side of the retaining wall 94 and an outer side of the retaining wall 94.

It should be noted that FIG. 2 only illustrates the case where one groove 14 is defined by the outer side the retaining wall 94. In actual implementation, a plurality of grooves 14 may also be defined by the outer side of the retaining wall 94.

Figure 3:
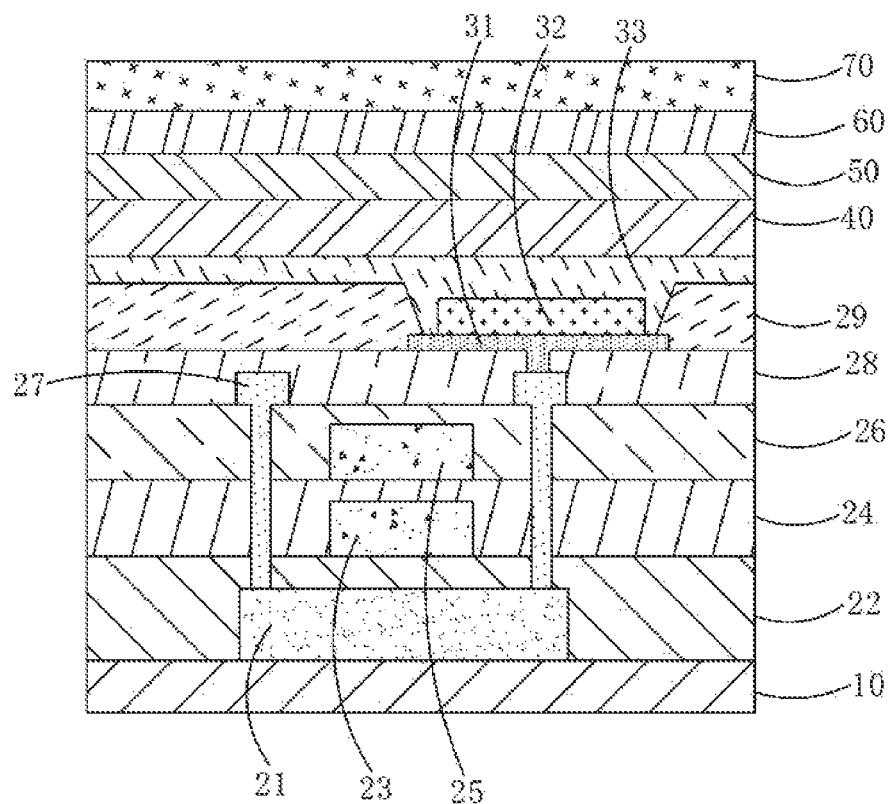
FIG. 3 is a schematic structural diagram of a display panel according to one embodiment of the present disclosure.

In one embodiment, as shown in FIG. 3, the array layer 20 includes an active layer 21 disposed on the substrate 10, a first gate insulating layer 22 covering the active layer 21, a first gate electrode layer 23 disposed on the first gate insulating layer 22, a second gate insulating layer 24 covering the first gate electrode layer 23, a second gate electrode layer 25 disposed on the second gate insulating layer 24, a interlayer dielectric layer 26 covering the second gate electrode layer 25, a source/drain 27 disposed on the interlayer dielectric layer 26, a planarization layer 28 covering the source/drain 27, and a pixel definition layer 29 disposed on the planarization layer 28.

Specifically, the light-emitting device layer 30 includes an anode metal layer 31 disposed on the planarization layer 28, a light-emitting layer 32 disposed on the anode metal layer 31, and a cathode metal layer 33 disposed on the pixel definition layer 29 and covering the light-emitting layer 32, wherein the encapsulation layer 40 is disposed on the cathode metal layer 33.

Specifically, the display panel further includes a polarizer 60 disposed on the touch layer 50, and a package cover plate 70 disposed on the polarizer 60.

The beneficial effects of the present disclosure are: the light-blocking layer 93 is used to fill the cracks 14 and the opening area 83 on the substrate 10, and planarize the substrate 10 to prevent the touch layer 50 from an uneven depth caused by the cracks 14 during the formation of the touch layer 50. In addition, the light-blocking layer 93 is also used to prevent light leakage at the opening 92, thereby avoiding the light leakage affecting the normal operation of the optical elements such as cameras.

In view of the above, although the present invention has been disclosed by way of preferred embodiments, the above preferred embodiments are not intended to limit the present invention, and one of ordinary skill in the art, without departing from the spirit and scope of the invention, the scope of protection of the present invention is defined by the scope of the claims.

What is claimed is:

1. A display panel, having a display area and an additional function area, the display area surrounding at least a portion of the additional function area, and the display panel comprising:
   a substrate;
   an array layer disposed on the substrate;
   a light-emitting device layer disposed on the array layer;
   an encapsulation layer covering the light-emitting device layer; and
   a touch layer disposed on the encapsulation layer;
   wherein an opening area surrounding the additional function area is disposed at an edge position of the additional function area, an opening penetrating the array layer and extending to a surface of the substrate is defined by the opening area, and the opening is filled with a light-blocking layer, and
   one or more grooves located in the opening area are defined by the substrate surrounding the additional function area, a portion of the encapsulation layer is in the groove, a portion of the encapsulation layer in the opening area is covered by the light-blocking layer, and the groove is filled with the light-blocking layer.

2. The display panel according to claim 1, wherein the light-blocking layer is made of a black material.

3. The display panel according to claim 2, wherein the black material comprises polyimide.

4. The display panel according to claim 1, wherein an upper surface of the light-blocking layer is flush with an upper surface of a portion of the encapsulation layer located in the display area.

5. The display panel according to claim 1, wherein a width of a bottom portion of the groove is greater than a width of a top portion of the groove.

6. The display panel according to claim 1, wherein the grooves are provided and spaced from each other.

7. The display panel according to claim 1, wherein a retaining wall located in the opening area is disposed on the substrate surrounding the additional function area.

8. The display panel according to claim 7, wherein the grooves are defined respectively by an inner side of the retaining wall and an outer side of the retaining wall.

9. The display panel according to claim 7, wherein a gap is defined between the retaining wall and an inner sidewall of the opening, and the light-blocking layer covers the retaining wall and fills the gap.

10. A display panel, having a display area and an additional function area, the display area surrounding at least a portion of the additional function area, and the display panel comprising:
    a substrate;
    an array layer disposed on the substrate;
    a light-emitting device layer disposed on the array layer;

an encapsulation layer covering the light-emitting device layer; and a touch layer disposed on the encapsulation layer;

wherein an opening area surrounding the additional function area is disposed at an edge position of the additional function area, an opening penetrating the array layer and extending to a surface of the substrate is defined by the opening area, and the opening is filled with a light-blocking layer, wherein the light-blocking layer is made of a black material, and an upper surface of the light-blocking layer is flush with an upper surface of a portion of the encapsulation layer located in the display area.

11. The display panel according to claim 10, wherein the black material comprises polyimide.

12. The display panel according to claim 10, wherein one or more grooves located in the opening area are defined by the substrate surrounding the additional function area.

13. The display panel according to claim 12, wherein a width of a bottom portion of the groove is greater than a width of a top portion of the groove.

14. The display panel according to claim 12, wherein a portion of the encapsulation layer is in the groove.

15. The display panel according to claim 14, wherein a portion of the encapsulation layer in the opening area is covered by the light-blocking layer, and the groove is filled with the light-blocking layer.

16. The display panel according to claim 12, wherein the grooves are provided and spaced from each other.

17. The display panel according to claim 12, wherein a retaining wall located in the opening area is disposed on the substrate surrounding the additional function area.

18. The display panel according to claim 17, wherein the grooves are defined respectively by an inner side of the retaining wall and an outer side of the retaining wall.

19. The display panel according to claim 17, wherein a gap is defined between the retaining wall and an inner sidewall of the opening, and the light-blocking layer covers the retaining wall and fills the gap.

\* \* \* \* \*